(12) United States Patent
Wang et al.

(10) Patent No.: US 9,886,206 B1
(45) Date of Patent: Feb. 6, 2018

(54) REPLICA BIT-LINE CONTROL CIRCUIT

(71) Applicant: Ningbo University, Zhejiang (CN)

(72) Inventors: Pengjun Wang, Zhejiang (CN); Keji Zhou, Zhejiang (CN); Huihong Zhang, Zhejiang (CN); Daohui Gong, Zhejiang (CN)

(73) Assignee: Ningbo University, Zhejiang (CN)

( * ) Notice: Subject to any disclaimer, the term of this patent is extended or adjusted under 35 U.S.C. 154(b) by 0 days.

(21) Appl. No.: 15/470,923

(22) Filed: Mar. 28, 2017

(30) Foreign Application Priority Data

Jul. 21, 2016 (CN) .......................... 2016 1 0585441

(51) Int. Cl.
 *G11C 7/12* (2006.01)
 *G06F 3/06* (2006.01)

(52) U.S. Cl.
 CPC ............ *G06F 3/0619* (2013.01); *G06F 3/065* (2013.01); *G06F 3/0625* (2013.01); *G06F 3/0688* (2013.01)

(58) Field of Classification Search
 CPC ...... G06F 3/0619; G06F 3/0625; G06F 3/065; G06F 3/0688
 USPC ........................................................ 365/210.1
 See application file for complete search history.

(56) References Cited

U.S. PATENT DOCUMENTS

| 9,576,621 B2* | 2/2017 | Seshadri | .................. | G11C 7/12 |
| 2014/0010032 A1* | 1/2014 | Seshadri | .................. | G11C 7/12 365/203 |

* cited by examiner

*Primary Examiner* — Han Yang
*Assistant Examiner* — Xiaochun L Chen
(74) *Attorney, Agent, or Firm* — JCIPRNET

(57) ABSTRACT

The present invention discloses a replica bit-line circuit, comprising a replica unit, the $1^{st}$ inverter, the $2^{nd}$ inverter, the $3^{rd}$ inverter, the $4^{th}$ inverter, the $5^{th}$ inverter, the $6^{th}$ inverter, the $7^{th}$ inverter, the $8^{th}$ inverter, the $9^{th}$ inverter, the $1^{st}$ NAND gate, the $2^{nd}$ NAND gate, the $3^{rd}$ NAND gate, the $1^{st}$ NOR gate, the $2^{nd}$ NOR gate and the $1^{st}$ PMOS tube; the $2^{nd}$ NOR gate is provided with the $1^{st}$ input terminal, the $2^{nd}$ input terminal, a set terminal and an output terminal; advantages of the present invention are stated as follows: It can inhibit feedback oscillation incurred by replica bit-line and replica wordline signal to obtain accurate wordline control signal; it can save switching power consumption of memory array by 53.7% under the power voltage of 1.2V.

3 Claims, 5 Drawing Sheets

REPLICA BIT-LINE CONTROL CIRCUIT

CROSS-REFERENCE TO RELATED APPLICATION

This application claims the priority benefit of China application serial no. 201610585441.1, filed on Jul. 21, 2016. The entirety of the above-mentioned patent application is hereby incorporated by reference herein and made a part of this specification.

FIELD OF THE INVENTION

The present invention is related to a control circuit, in particular to a replica bit-line control circuit.

BACKGROUND

Presently, SARM power consumption is mainly reduced by introducing replica bit-line control circuit 100 to SRAM to produce sensitivity amplifier enabling signals SAE and wordline control signals WL. The schematic block diagram is as shown in FIG. 1. A replica bit-line control circuit is proposed by Amrutur B S, Horowitz M. in A replica technique for wordline and sense control in low-power SRAM's [J]. IEEE Journal of Solid-State Circuits, 1998, 33(8): 1208, which is as shown in FIG. 2. When sense amplifier enabling signals are valid, wordline control signal WL of the replica bit-line control circuit is to be cut off through time delay by the inverter S9 and NOR gate D1, which may further result in unnecessary voltage loss; furthermore, a feedback oscillation is to be produced when chip selection signal BS is set at high electrical level for a prolonged time, which may continuously charge and discharge the capacitor of replica wordline signal RWL and replica bit-line RBL to the extent of incurring unnecessary power consumption; the feedback oscillation waveform is as shown in FIG. 3.

SUMMARY OF THE INVENTION

The technical issue to be settled by the present invention is to provide a replica bit-line control circuit that can significantly reduce SRAM power consumption.

Technical solution used by the present invention to settled aforesaid technical issues is stated as follows: A replica bit-line control circuit, comprising a replica unit, the $1^{st}$ inverter, the $2^{nd}$ inverter, the $3^{rd}$ inverter, the $4^{th}$ inverter, the $5^{th}$ inverter, the $6^{th}$ inverter, the $7^{th}$) inverter, the $8^{th}$ inverter and the $9^{th}$ inverter, the $1^{st}$ NAND gate, the $2^{nd}$ NAND gate, the $3^{rd}$ NAND gate, the $1^{st}$ NOR gate, the $2^{nd}$ NOR gate and the $1^{st}$ PMOS tube; the $1^{st}$ NAND gate, the $2^{nd}$ NAND gate, the $3^{rd}$ NAND gate and the $1^{st}$ NOR gate are provided with the $1^{st}$ input terminal, the $2^{nd}$ input terminal and an output terminal respectively; the $2^{nd}$ NOR gate is provided with the $1^{st}$ input terminal, the $2^{nd}$ input terminal, a set terminal and an output terminal; the said replica unit comprises a drive unit and numerous load units; the said drive unit is provided with an input/output terminal, a complementary input/output terminal and a control terminal; the said load unit is provided with an input/output terminal and a complementary input/output terminal; input/output terminal of the said drive unit is connected to input/output terminal of numerous load units, and the connecting line is the replica bit-line of the said replica unit; complementary input/output terminal of the said drive unit is connected to complementary input/output terminal of numerous load units; the $1^{st}$ input terminal of the $1^{st}$ NAND gate is the $1^{st}$ input terminal of the said replica bit-line control circuit, used to receive global wordline control signals; the $1^{st}$ input terminal of the $2^{nd}$ NAND gate is connected to the input terminal of the $3^{rd}$ NAND gate, and the connecting terminal is the $2^{nd}$ input terminal of the said replica bit-line control circuit, used to receive chip selection signals; the $2^{nd}$ input terminal of the $2^{nd}$ NAND gate is connected to the input terminal of the $9^{th}$ inverter, and the connecting terminal is the $3^{rd}$ input terminal of the said replica bit-line control circuit, used to receive writing control signals; output terminal of the $2^{nd}$ NAND gate is connected to the $1^{st}$ input terminal of the $2^{nd}$ NOR gate; output terminal of the $9^{th}$ inverter is connected to the $2^{nd}$ input terminal of the $3^{rd}$ NAND gate; output terminal of the $3^{rd}$ NAND gate and input terminal of the $8^{th}$ inverter are connected to the grid of the PMOS tube; output terminal of the $8^{th}$ inverter is connected to the $1^{st}$ input terminal of the $1^{st}$ NOR gate; output terminal of the $1^{st}$ NOR gate and the $2^{nd}$ input terminal of the $2^{nd}$ NOR gate are connected to the control terminal of the said drive unit; set terminal of the $2^{nd}$ NOR gate, drain of the $1^{st}$ PMOS tube and input terminal of the $1^{st}$ inverter are connected to the replica bit-line of the said replica unit; source of the $1^{st}$ PMOS tube is connected to the power supply; output terminal of the $2^{nd}$ NOR gate is connected to the input terminal of the $6^{th}$ inverter; output terminal of the $6^{th}$ inverter is connected to the $2^{nd}$ input terminal of the $1^{st}$ NAND gate; output terminal of the $1^{st}$ NAND gate is connected to the input terminal of the $7^{th}$ inverter; output terminal of the $7^{th}$ inverter is the $1^{st}$ output terminal of the said replica bit-line, which is used to output wordline control signals; output terminal of the $1^{st}$ inverter and input terminal of the $2^{nd}$ inverter are connected to the $2^{nd}$ input terminal of the $1^{st}$ NOR gate; output terminal of the $2^{nd}$ inverter is connected to the input terminal of the $3^{rd}$ inverter; output terminal of the $3^{rd}$ inverter is connected to the input terminal of the $4^{th}$ inverter; output terminal of the $4^{th}$ inverter is connected to the input terminal of the $5^{th}$ inverter; output terminal of the $5^{th}$ inverter is the $2^{nd}$ output terminal of the said replica bit-line control circuit, used to output sense amplifier enabling signals; the $2^{nd}$ NOR gate comprises the $2^{nd}$ PMOS tube, the $3^{rd}$ PMOS tube, the $4^{th}$ PMOS tube, the $1^{st}$ NMOS tube, the $2^{nd}$ NMOS tube and the $3^{rd}$ NMOS tube; source of the $2^{nd}$ PMOS tube and the $4^{th}$ PMOS tube is connected to the power supply respectively; drain of the $2^{nd}$ PMOS tube is connected to the source of the $3^{rd}$ PMOS tube; grid of the $2^{nd}$ PMOS tube is connected to the grid of the $2^{nd}$ NMOS tube, and the connecting terminal is the $1^{st}$ input terminal of the $2^{nd}$ NOR gate; grid of the $3^{rd}$ PMOS tube is connected to the grid of the $1^{st}$ NMOS tube, and the connecting terminal is the $2^{nd}$ input terminal of the $2^{nd}$ NOR gate; drain of the $3^{rd}$ PMOS tube, the $1^{st}$ NMOS tube and the $4^{th}$ PMOS tube is connected to the drain of the $2^{nd}$ NMOS tube, and the connecting terminal is the output terminal of the $2^{nd}$ NOR gate; source of the $1^{st}$ NMOS tube and drain of the $3^{rd}$ NMOS tube are connected to the source of the $2^{nd}$ NMOS tube; grid of the $3^{rd}$ NMOS tube is connected to the grid of the $4^{th}$ PMOS tube, and the connecting terminal is the set terminal of the $2^{nd}$ NOR gate; source of the $3^{rd}$ NMOS tube is grounded.

The said load unit comprises the $5^{th}$ PMOS tube, the $6^{th}$ PMOS tube; the $4^{th}$ NMOS tube, the $5^{th}$ NMOS tube, the $6^{th}$ NMOS tube and the $7^{th}$ NMOS tube; source of the $5^{th}$ PMOS tube, drain of the $5^{th}$ PMSO tube, drain of the $4^{th}$ NMOS tube, drain of the $6^{th}$ NMOS tube, source of the $6^{th}$ PMOS tube; grid of the $6^{th}$ PMOS tube and grid of the $5^{th}$ NMOS tube are connected to power supply respectively; grid of the $5^{th}$ PMOS tube, grid of the $4^{th}$ NMOS tube, drain of the $6^{th}$ PMOS tube and drain of the $5^{th}$ NMOS tube are connected to the drain of the 7$^{th}$ NMOS tube; source of the 4$^{th}$ NMOS tube, source of the 5$^{th}$ NMOS tube, grid of the 6$^{th}$ NMOS tube and grid of the 7$^{th}$ NMOS tube are grounded respectively; source of the 6$^{th}$ NMOS tube is the output terminal of the said load unit; source of the 7$^{th}$ NMOS tube is the complementary input/output terminal of the said load unit. Structure of the circuit is similar to that of the memory unit in the memory array, which can effectively guard against impact from such factors as threshold voltage, power voltage and ambient temperature; furthermore, as source of the 5$^{th}$ PMOS tube, drain of the 4$^{th}$ NMOS tube and drain of the 6$^{th}$ NMOS tube are connected to the power supply, it can effectively accommodate the slowest discharge of replica bit-line under the impact of leakage current.

The said drive unit comprises the 7$^{th}$ PMOS tube, the 8$^{th}$ PMOS tube, the 8$^{th}$ NMOS tube, the 9$^{th}$ NMOS tube, the 10$^{th}$ NMOS tube and the 11$^{th}$ NMOS tube; source of the 7$^{th}$ PMOS tube, grid of the 7$^{th}$ PMOS tube, grid of the 8$^{th}$ NMOS tube, drain of the 8$^{th}$ PMOS tube, source of the 8$^{th}$ PMOS tube, drain of the 9$^{th}$ NMOS tube and drain of the 11$^{th}$ NMOS tube are connected to the power supply respectively; drain of the 7$^{th}$ PMOS tube, drain of the 8$^{th}$ NMOS tube, drain of the 10$^{th}$ NMOS tube and grid of the 8$^{th}$ PMOS tube are connected to the grid of the 9$^{th}$ NMOS tube; source of the 8$^{th}$ NMOS tube and source of the 9$^{th}$ NMOS tube are grounded respectively; grid of the 10$^{th}$ NMOS tube is connected to the grid of the 11$^{th}$ NMOS tube, and the connecting terminal is the control terminal of the said drive unit; source of the 10$^{th}$ NMOS tube is the input/output terminal of the said drive unit; source of the 11$^{th}$ NMOS tube is the complementary input/output terminal of the said drive unit. Structure of the circuit is similar to that of the memory unit in the memory array, which can effectively guard against impact from such factors as threshold voltage, power voltage and ambient temperature; furthermore, as drain of the 7$^{th}$ PMOS tube, drain of the 8$^{th}$ NMOS tube and drain of the 10$^{th}$ NMOS tube are grounded, it can simulate discharge of the bit-line in the memory array to the ground.

As compared with prior art, the present invention has the following advantages: When sense amplifier enabling signals are valid, it can ensure timely cutoff of wordline control signals through balancing time delay for on/off of wordline control signals to minimize switching power consumption as incurred by unnecessary discharging by the memory array pairs. Moreover, it makes use of the 2$^{nd}$ NAND gate, the 3$^{rd}$ NAND gate and the 9$^{th}$ inverter to decompose chip selection signals to generate clock reading control signals in substitution of replica wordline signal control for charging of replica bit-line; it can effectively inhibit feedback oscillation incurred by replica bit-line and replica wordline signals to obtain accurate and stable wordline control signals for the purpose of reducing SRAM power consumption; as indicated comparison between the present invention and replica bit-line control circuit as applied to fully customized 2 Mb SRAM circuit based on the technique of SMIC 65 nm CMOS, the present invention can save the switching power consumption of memory array by 53.7% under the power voltage of 1.2V.

DESCRIPTION OF EMBODIMENTS

Figure 1:
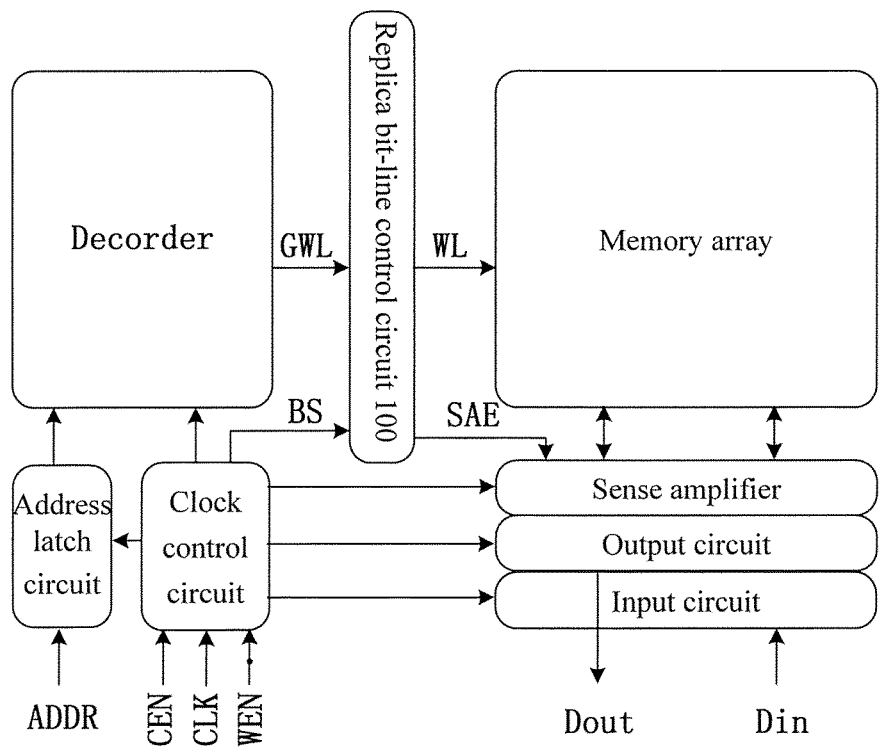
FIG. 1 is the structural block diagram for SRAM of existing replica bit-line control circuit.
Figure 2:
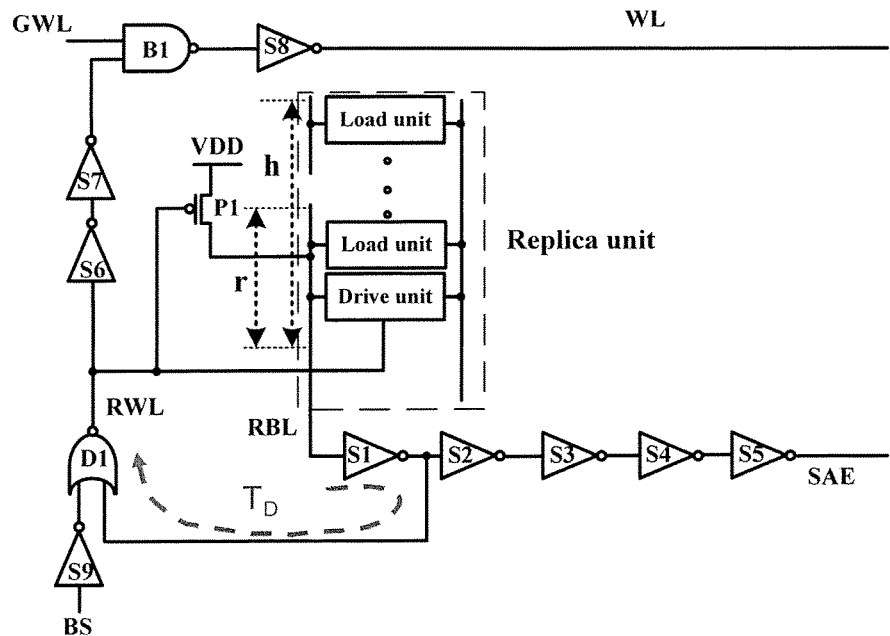
FIG. 2 is the structural diagram for existing replica bit-line control circuit.
Figure 3:
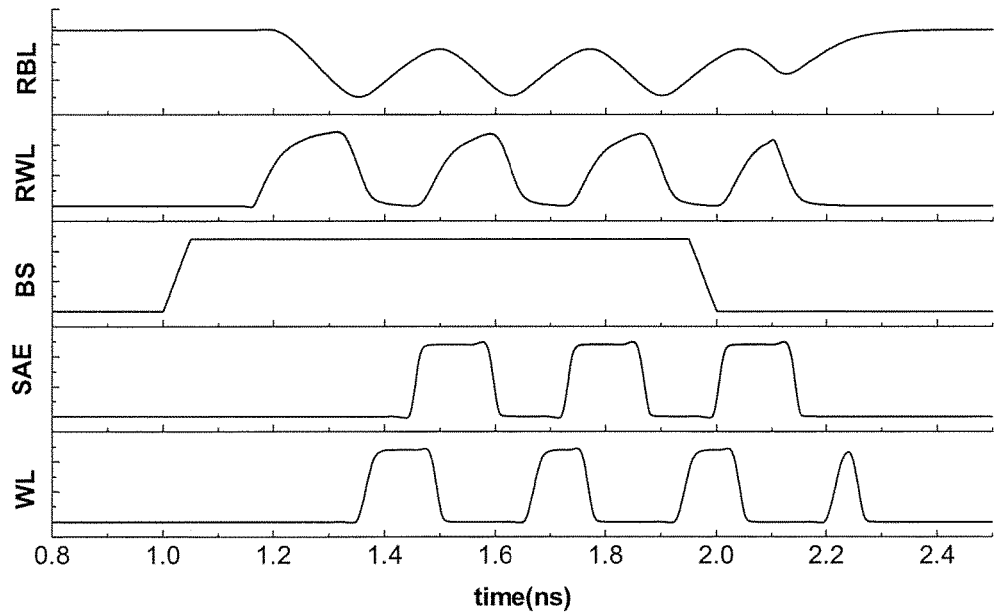
FIG. 3 is the feedback oscillation diagram for existing replica bit-line control circuit.
Figure 4:
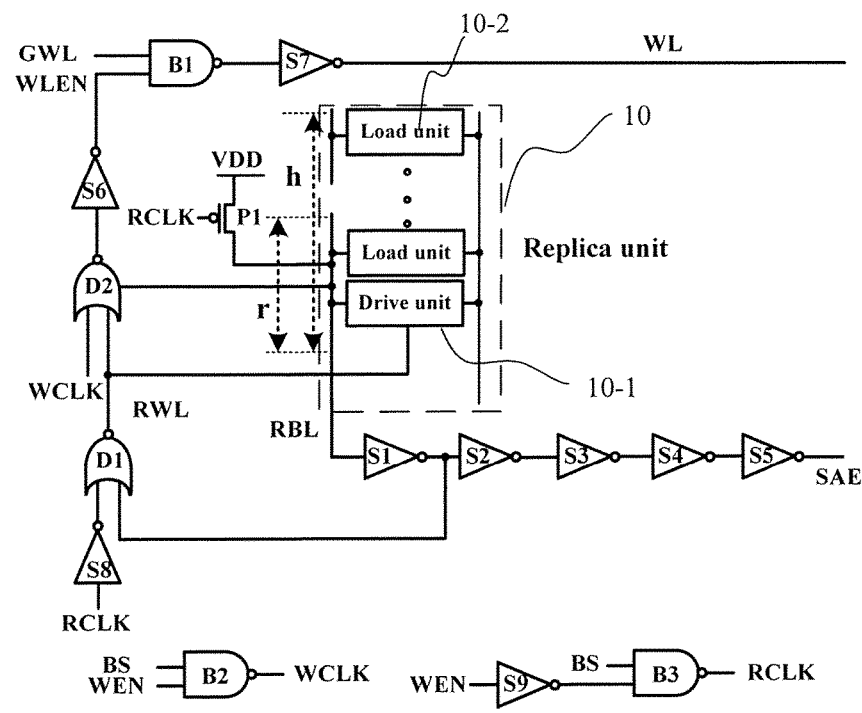
FIG. 4 is the structural diagram for the present invention.
Figure 5:
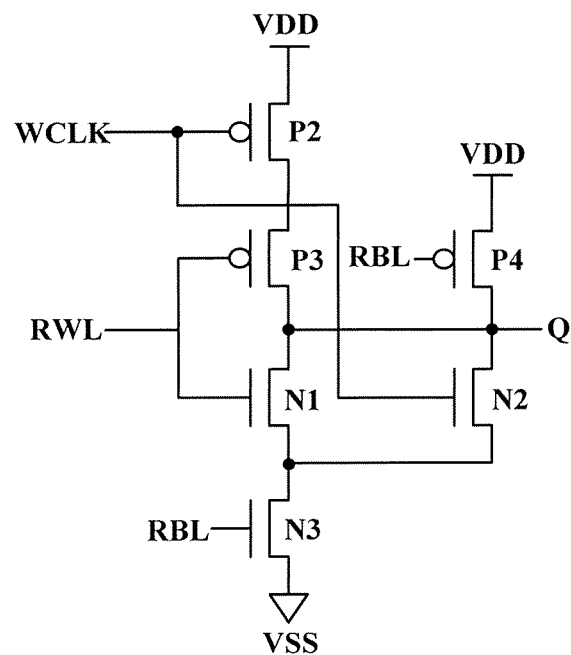
FIG. 5 is the circuit diagram for the 2$^{nd}$ NOR gate of the present invention.

The present invention is further described as follows in combination with drawings and embodiments:

Embodiment: As shown in FIG. 4, a replica bit-line control circuit, comprising a replica unit 10, a 1$^{st}$ inverter S1, a 2$^{nd}$ inverter S2, a 3$^{rd}$ inverter S3, a 4$^{th}$ inverter S4, a 5$^{th}$ inverter S5, a 6$^{th}$ inverter S6, a 7$^{th}$ inverter S7, a 8$^{th}$ inverter S8 and a 9$^{th}$ inverter S9, a 1$^{st}$ NAND gate B1, a 2$^{nd}$ NAND gate B2, a 3$^{rd}$ NAND gate B3, a NOR gate D1, a 2$^{nd}$ NOR gate D2 and a PMOS tube P1. The 1$^{st}$ NAND gate B1, the 2$^{nd}$ NAND gate B2, the 3$^{rd}$ NAND gate B3 and the 1$^{st}$ NOR gate D1 are provided with the 1$^{st}$ input terminal, the 2$^{nd}$ input terminal and an output terminal respectively. The 2$^{nd}$ NOR gate B2 is provided with the 1$^{st}$ input terminal, the 2$^{nd}$ input terminal, a set terminal and an output terminal. The said replica unit 10 comprises a drive unit 10-1 and a plurality of load units 10-2. The said drive unit 10-1 is provided with an input/output terminal, a complementary input/output terminal and a control terminal. Each of the said load units 10-2 is provided with an input/output terminal and a complementary input/output terminal; input/output terminal of the said drive unit 10-1 is connected to input/output terminal of the plurality of load units 10-2, and the connecting line is the replica bit-line RBL of the said replica unit 10; the complementary input/output terminal of the said drive unit 10-1 is connected to complementary input/output terminal of the load units 10-2; the 1$^{st}$ input terminal of the 1$^{st}$ NAND gate B1 is the 1 input terminal of the said replica bit-line control circuit, used to receive global wordline control signal GWL; the 1$^{st}$ input terminal of the 2$^{nd}$ NAND gate B2 is connected to the 1$^{st}$ input terminal of the 3$^{rd}$ NAND gate B3, and the connecting terminal is the 2$^{nd}$ input terminal of the said replica bit-line control circuit, used to receive chip selection signal BS; the 2$^{nd}$ input terminal of the 2$^{nd}$ NAND gate B2 is connected to the input terminal of the 9$^{th}$ inverter S9, and the connecting terminal is the 3$^{rd}$ input terminal of the said replica bit-line control circuit, used to receive writing control signal WEN; output terminal of the 2$^{nd}$ NAND gate B2 is connected to the 1$^{st}$ input terminal of the 2$^{nd}$ NOR gate D2; output terminal of the 9$^{th}$ inverter S9 is connected to the 2$^{nd}$ input terminal of the 3$^{rd}$ NAND gate B3; output terminal of the 3$^{rd}$ NAND gate B3 and input terminal of the 8$^{th}$ inverter S8 are connected to the grid of the 1$^{st}$ PMOS tube P1; output terminal of the 8$^{th}$ inverter S8 is connected to the input terminal of the 1$^{st}$ NOR gate D1; output terminal of the 1$^{st}$ NOR gate D1 and the 2$^{nd}$ input terminal of the 2$^{nd}$ NOR gate D2 are connected to the control to terminal of the said drive unit 10-1; set terminal of the 2$^{nd}$ NOR gate D2, drain of the 1$^{st}$ PMOS tube P1 and input terminal of the 1$^{st}$ inverter S1 are connected to the replica bit-line of the said replica unit 10; source of the 1$^{st}$ PMOS tube P1 is connected to the power supply VDD; output terminal of the 2$^{nd}$ NOR gate D2 is connected to the input terminal of the 6$^{th}$ inverter S6; output terminal of the 6$^{th}$ inverter S6 is connected to the 2$^{nd}$ input terminal of the $1^{st}$ NAND gate B1; output terminal of the $1^{st}$ NAND gate B1 is connected to the input terminal of the $7^{th}$ inverter S7; output terminal of the $7^{th}$ inverter S7 is the $1^{st}$ output terminal of the said replica bit-line, which is used to output wordline control signal WL; output terminal of the $1^{st}$ inverter S1 and input terminal of the $2^{nd}$ inverter S2 are connected to the $2^{nd}$ input terminal of the $1^{st}$ NOR gate D1; output terminal of the $2^{nd}$ inverter S2 is connected to the input terminal of the $3^{rd}$ inverter S3; output terminal of the $3^{rd}$ inverter S3 is connected to the input terminal of the $4^{th}$ inverter S4; output terminal of the $4^{th}$ inverter S4 is connected to the input terminal of the $5^{th}$ inverter S5; output terminal of the $5^{th}$ inverter S5 is the $2^{nd}$ output terminal of the said replica bit-line control circuit, used to output sense amplifier enabling signal SAE;

As shown in FIG. 5, the $2^{nd}$ NOR gate D2 comprises a $2^{nd}$ PMOS tube P2, a $3^{rd}$ PMOS tube P3, a $4^{th}$ PMOS tube P4, a $1^{st}$ NMOS tube N1, a $2^{nd}$ NMOS tube N2 and a $3^{rd}$ NMOS tube N3; source of the $2^{nd}$ PMOS tube P2 and the $4^{th}$ PMOS tube P4 is connected to the power supply VDD respectively; drain of the $2^{nd}$ PMOS tube P2 is connected to the source of the $3^{rd}$ PMOS tube P3; grid of the $2^{nd}$ PMOS tube P2 is connected to the grid of the $2^{nd}$ NMOS tube N2, and the connecting terminal is the $1^{st}$ input terminal of the $2^{nd}$ NOR gate D2; grid of the $3^{rd}$ PMOS tube P3 is connected to the grid of the $1^{st}$ NMOS tube N1, and the connecting terminal is the $2^{nd}$ input terminal of the $2^{nd}$ NOR gate D2; drain of the $3^{rd}$ PMOS tube P3, the $1^{st}$ NMOS tube N1 and the $4^{th}$ PMOS tube P4 is connected to the drain of the $2^{nd}$ NMOS tube N2, and the connecting terminal is the output terminal of the $2^{nd}$ NOR gate D2; source of the NMOS tube N1 and drain of the $3^{rd}$ NMOS tube N3 are connected to the source of the $2^{nd}$ NMOS tube N2; grid of the $3^{rd}$ NMOS tube N3 is connected to the grid of the $4^{th}$ PMOS tube P4, and the connecting terminal is the set terminal of the $2^{nd}$ NOR gate D2; source of the $3^{rd}$ NMOS tube N3 is grounded VSS.

Figure 6:
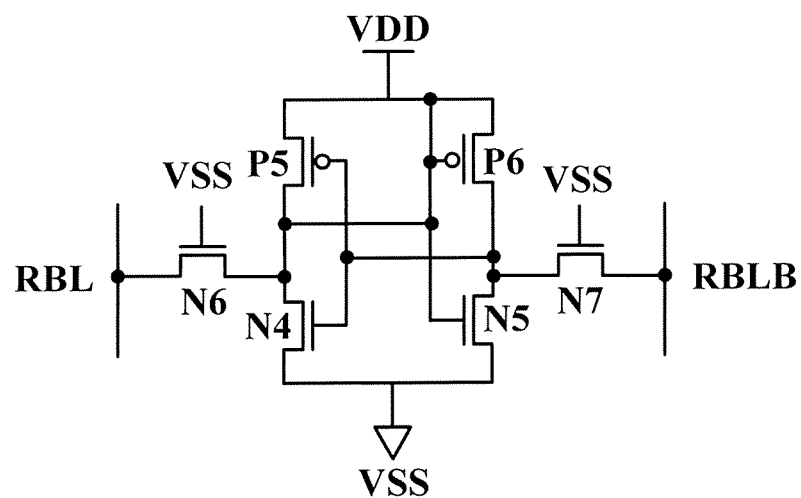
FIG. 6 is the circuit diagram for the load unit of the present invention.

As shown in FIG. 6, each of the load unit 10-2 in this embodiment comprises a $5^{th}$ PMOS tube P5, a $6^{th}$ PMOS tube P6, a $4^{th}$ NMOS tube N4, a $5^{th}$ NMOS tube N5, a $6^{th}$ NMOS tube N6 and a $7^{th}$ NMOS tube N7. A source of the $5^{th}$ PMOS tube P5, a drain of the $5^{th}$ PMSO tube P5, a drain of the $4^{th}$ NMOS tube N4, a drain of the $6^{th}$ NMOS tube N6, a source of the $6^{th}$ PMOS tube P6, a grid of the $6^{th}$ PMOS tube P6 and a grid of the $5^{th}$ NMOS tube N5 are connected to power supply VDD respectively. A grid of the $5^{th}$ PMOS tube P5, a grid of the $4^{th}$ NMOS tube N4, a drain of the $6^{th}$ PMOS tube P6 and a drain of the $5^{th}$ NMOS tube N5 are connected to a drain of the $7^{th}$ NMOS tube N7. A source of the $4^{th}$ NMOS tube N4, a source of the $5^{th}$ NMOS tube N5, a grid of the $6^{th}$ NMOS tube N6 and a grid of the $7^{th}$ NMOS tube N7 are grounded VSS respectively. A source of the $6^{th}$ NMOS tube N6 is the output terminal of the said load unit 10-2. A source of the $7^{th}$ NMOS tube N7 is the complementary input/output terminal of the said load unit 10-2.

Figure 7:
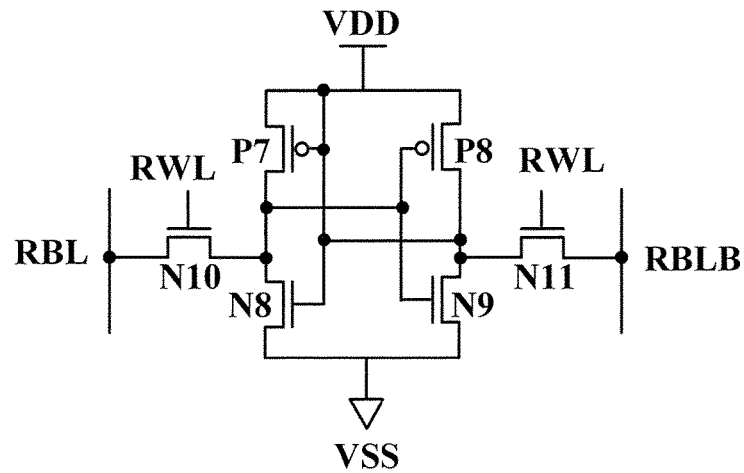
FIG. 7 is the circuit diagram for the drive unit of the present invention.

As shown in FIG. 7, the drive unit 10-1 in this embodiment comprises a $7^{th}$ PMOS tube P7, a $8^{th}$ PMOS tube P8, a $8^{th}$ NMOS tube N8, a $9^{th}$ NMOS tube N9, a $10^{th}$ NMOS tube N10 and a $11^{th}$ NMOS tube N11. Source of the $7^{th}$ PMOS tube P7, grid of the $7^{th}$ PMOS tube P7, grid of the $8^{th}$ NMOS tube N8, drain of the $8^{th}$ PMOS tube P8, source of the $8^{th}$ PMOS tube P8, drain of the $9^{th}$ NMOS tube N9 and drain of the $11^{th}$ NMOS tube N11 are connected to the power supply VDD respectively; drain of the $7^{th}$ PMOS tube P7, drain of the $8^{th}$ NMOS tube N8, drain of the $10^{th}$ NMOS tube N10 and grid of the $8^{th}$ PMOS tube P8 are connected to the grid of the $9^{th}$ NMOS tube N9; source of the $8^{th}$ NMOS tube N8 and source of the $9^{th}$ NMOS tube N9 are grounded VSS respectively; grid of the $10^{th}$ NMOS tube N10 is connected to the grid of the $11^{th}$ NMOS tube N11, and the connecting terminal is the control terminal of the said drive unit 10-1; source of the $10^{th}$ NMOS tube N10 is the input/output terminal of the said drive unit 10-1; source of the $11^{th}$ NMOS tube N11 is the complementary input/output terminal of the said drive unit 10-1.

In this embodiment, the $1^{st}$ inverter S1, the $2^{nd}$ inverter S2, the inverter S3, the $4^{th}$ inverter S4, the $5^{th}$ inverter S5, the $6^{th}$ inverter S6, the $7^{th}$ inverter S7, the $8^{th}$ inverter S8, the $9^{th}$ inverter S9, the $1^{st}$ NAND gate B1, the $2^{nd}$ NAND gate B2, the $3^{rd}$ NAND gate B3 and the $1^{st}$ NOR gate D1 are well-established products of prior arts.

Figure 8:
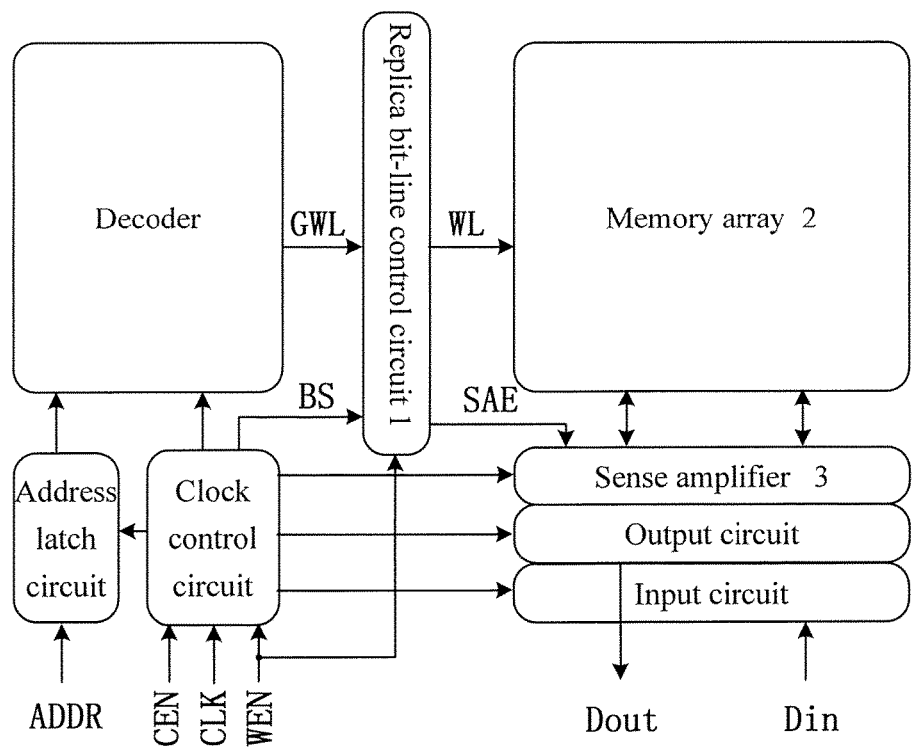
FIG. 8 is the structural block diagram for SRAM of the present invention.

Wiring block diagram for the replica bit-line control circuit 1 of the present invention as applied to SRAM is as shown in FIG. 8.

Figure 9:
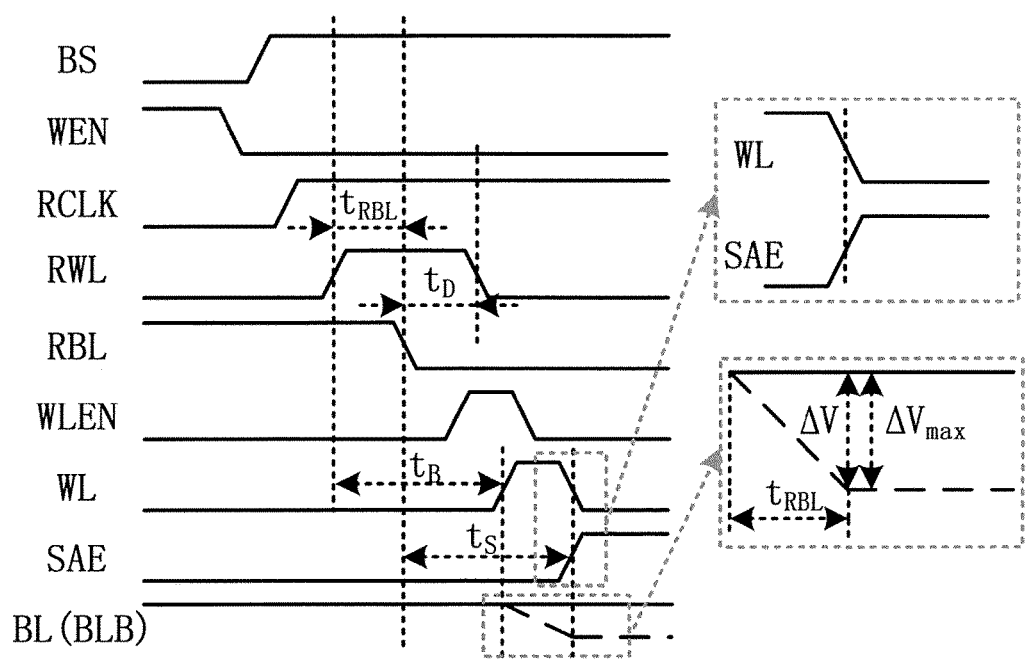
FIG. 9 is the signal timing diagram for the present invention

Working principle of the replica bit-line control circuit 1 of the present invention is stated as follows: writing clock control signal WCLK at the beginning of writing operation can directly control the wordline enabling signal WLEN to determine on/off of the wordline control signal of memory array 2 in together with global wordline control signal. For reading operation, signal timing for the replica bit-line control circuit 1 of the present invention is as shown in FIG. 9; wherein, BL and BLB represent a bit-line pair used for charging in the memory array; prior to the commencement of reading cycle, reading clock control signal RCLK is to be maintained at a low electrical level; whereas replica bit-line of the replica unit 10 RBL is to be set at a high electrical level; replica wordline signal RWL, wordline control signal WL and sense amplifier enabling signal SAE are to be set at a low electrical level; at the beginning of reading operation, reading clock control signal RCLK and replica wordline signal RWL are to be set at a high electrical level to control discharging of line capacitor of replica bit-line RBL by the replica unit 10; meanwhile, global wordline control signal GWL is to be set at a high electrical level; replica wordline signal RWL makes use of the $2^{nd}$ NOR gate D2, the $6^{th}$ inverter S6, the $1^{st}$ NAND gate B1 and the $7^{th}$ inverter S7 to generate valid wordline control signal WL to control discharging of the bit-line BL and BLB by memory unit of the memory array 2. When replica bit-line is set at a low electrical level, sense amplifier enabling signal SAE is to be set at a high electrical level to turn on the sense amplifier 3 following time delay of the $1^{st}$ inverter S1~the $5^{th}$ inverter S5; as the $2^{nd}$ NOR gate D2 is controlled by replica bit-line RBL of the replica unit 10, on/off of wordline control signal WL is not to be determined by replica wordline signal RWL; once replica bit-line RBL of the replica unit 10 is set at a high electrical level, it is applicable to make use of the $2^{nd}$ NOR gate, the 6 inverter S6, the $1^{st}$ NAND gate B1 and the $7^{th}$ inverter S7 to turn off wordline control signal WL, eliminate the time delay incurred by the $1^{st}$ inverter S1 and the $1^{st}$ NOR gate D1, and make the opening time $T_{pulse,WL}$ of wordline control signal WL equal to the discharging time $T_{rbl}$ of replica bit-line RBL. As a result, wordline control signal WL can be turned off in time to prevent unnecessary power consumption, and significantly reduce SRAM power consumption when the sense amplifier 3 is turned on.

What is claimed is:
1. A replica bit-line control circuit, comprising: a replica unit, a $1^{st}$ inverter, a $2^{nd}$ inverter, a $3^{rd}$ inverter, a $4^{th}$ inverter, a $5^{th}$ inverter, a $6^{th}$ inverter, a $7^{th}$ inverter, a $8^{th}$ inverter and a $9^{th}$ inverter, a $1^{st}$ NAND gate, a $2^{nd}$ NAND gate, a $3^{rd}$ NAND gate, a $1^{st}$ NOR gate, a $2^{nd}$ NOR gate and a $1^{st}$ PMOS tube, wherein the $1^{st}$ NAND gate, the $2^{nd}$ NAND gate, the $3^{rd}$ NAND gate and the $1^{st}$ NOR gate are provided with a $1^{st}$ input terminal, a $2^{nd}$ input terminal and an output terminal respectively; the $2^{nd}$ NOR gate is provided with a $1^{st}$ input terminal, a $2^{nd}$ input terminal, a set terminal and an output terminal; the said replica unit comprises a drive unit and a plurality of load units; the said drive unit is provided with an input/output terminal, a complementary input/output terminal and a control terminal; each of the said load units is provided with an input/output terminal and a complementary input/output terminal; the input/output terminal of the said drive unit is connected to the input/output terminal of the plurality of load units, and the connecting line is the replica bit-line of the said replica unit; wherein the complementary input/output terminal of the said drive unit is connected to the complementary input/output terminal of the plurality of load units; the $1^{st}$ input terminal of the $1^{st}$ NAND gate is a $1^{st}$ input terminal of the said replica bit-line control circuit, used to receive global wordline control signals; the $1^{st}$ input terminal of the $2^{nd}$ NAND gate is connected to the $1^{st}$ input terminal of the $3^{rd}$ NAND gate, and the connecting terminal is a $2^{nd}$ input terminal of the said replica bit-line control circuit, used to receive chip selection signals; the $2^{nd}$ input terminal of the $2^{nd}$ NAND gate is connected to an input terminal of the $9^{th}$ inverter, and the connecting terminal is the $3^{rd}$ input terminal of the said replica bit-line control circuit, used to receive writing control signals; the output terminal of the $2^{nd}$ NAND gate is connected to the $1^{st}$ input terminal of the $2^{nd}$ NOR gate; an output terminal of the $9^{th}$ inverter is connected to the $2^{nd}$ input terminal of the $3^{rd}$ NAND gate; the output terminal of the $3^{rd}$ NAND gate and an input terminal of the $8^{th}$ inverter are connected to a grid of the $1^{st}$ PMOS tube; an output terminal of the $8^{th}$ inverter is connected to the $1^{st}$ input terminal of the $1^{st}$ NOR gate; the output terminal of the $1^{st}$ NOR gate and the $2^{nd}$ input terminal of the $2^{nd}$ NOR gate are connected to the control terminal of the said drive unit; the set terminal of the $2^{nd}$ NOR gate, an drain of the $1^{st}$ PMOS tube and an input terminal of the $1^{st}$ inverter are connected to the replica bit-line of the said replica unit; a source of the $1^{st}$ PMOS tube is connected to a power supply; the output terminal of the $2^{nd}$ NOR gate is connected to the input terminal of the $6^{th}$ inverter; an output terminal of the $6^{th}$ inverter is connected to the $2^{nd}$ input terminal of the $1^{st}$ NAND gate; the output terminal of the $1^{st}$ NAND gate is connected to an input terminal of the $7^{th}$ inverter; an output terminal of the $7^{th}$ inverter is the $1^{st}$ output terminal of the said replica bit-line, which is used to output wordline control signals; an output terminal of the $1^{st}$ inverter and an input terminal of the $2^{nd}$ inverter are connected to the $2^{nd}$ input terminal of the $1^{st}$ NOR gate; an output terminal of the $2^{nd}$ inverter is connected to an input terminal of the $3^{rd}$ inverter; an output terminal of the $3^{rd}$ inverter is connected to an input terminal of the $4^{th}$ inverter; an output terminal of the $4^{th}$ inverter is connected to an input terminal of the $5^{th}$ inverter; an output terminal of the $5^{th}$ inverter is a $2^{nd}$ output terminal of the said replica bit-line control circuit, used to output sense amplifier enabling signals; wherein the $2^{nd}$ NOR gate comprises a $2^{nd}$ PMOS tube, a $3^{rd}$ PMOS tube, a $4^{th}$ PMOS tube, a $1^{st}$ NMOS tube, a $2^{nd}$ NMOS tube and a $3^{rd}$ NMOS tube; a source of each of the $2^{nd}$ PMOS tube and the $4^{th}$ PMOS tube is connected to the power supply respectively; a drain of the $2^{nd}$ PMOS tube is connected to a source of the $3^{rd}$ PMOS tube; a grid of the $2^{nd}$ PMOS tube is connected to a grid of the $2^{nd}$ NMOS tube, and the connecting terminal is the $1^{st}$ input terminal of the $2^{nd}$ NOR gate; a grid of the $3^{rd}$ PMOS tube is connected to a grid of the $1^{st}$ NMOS tube, and the connecting terminal is the $2^{nd}$ input terminal of the $2^{nd}$ NOR gate; a drain of each of the $3^{rd}$ PMOS tube, the $1^{st}$ NMOS tube and the $4^{th}$ PMOS tube is connected to a drain of the $2^{nd}$ NMOS tube, and the connecting terminal is the output terminal of the $2^{nd}$ NOR gate; a source of the $1^{st}$ NMOS tube and a drain of the $3^{rd}$ NMOS tube are connected to a source of the $2^{nd}$ NMOS tube; a grid of the $3^{rd}$ NMOS tube is connected to a grid of the $4^{th}$ PMOS tube, and the connecting terminal is the set terminal of the $2^{nd}$ NOR gate; a source of the $3^{rd}$ NMOS tube is grounded.

2. The replica bit-line control circuit according to claim 1, wherein the said load unit comprises a $5^{th}$ PMOS tube, a $6^{th}$ PMOS tube; a $4^{th}$ NMOS tube, a $5^{th}$ NMOS tube, a $6^{th}$ NMOS tube and a $7^{th}$ NMOS tube; a source of the $5^{th}$ PMOS tube, a drain of the $5^{th}$ PMSO tube, a drain of the $4^{th}$ NMOS tube, a drain of the $6^{th}$ NMOS tube, a source of the $6^{th}$ PMOS tube, a grid of the $6^{th}$ PMOS tube and a grid of the $5^{th}$ NMOS tube are connected to the power supply respectively; a grid of the $5^{th}$ PMOS tube, a grid of the $4^{th}$ NMOS tube, a drain of the $6^{th}$ PMOS tube and a drain of the $5^{th}$ NMOS tube are connected to a drain of the $7^{th}$ NMOS tube; a source of the $4^{th}$ NMOS tube, a source of the $5^{th}$ NMOS tube, a grid of the $6^{th}$ NMOS tube and a grid of the $7^{th}$ NMOS tube are grounded respectively; a source of the $6^{th}$ NMOS tube is the output terminal of the said load unit; a source of the $7^{th}$ NMOS tube is the complementary input/output terminal of the said load unit.

3. The replica bit-line control circuit according to claim 1, wherein the said drive unit comprises a $7^{th}$ PMOS tube, a $8^{th}$ PMOS tube, a $8^{th}$ NMOS tube, a $9^{th}$ NMOS tube, a $10^{th}$ NMOS tube and a $11^{th}$ NMOS tube; a source of the $7^{th}$ PMOS tube, a grid of the $7^{th}$ PMOS tube, a grid of the $8^{th}$ NMOS tube, a drain of the $8^{th}$ PMOS tube, a source of the $8^{th}$ PMOS tube, a drain of the $9^{th}$ NMOS tube and a drain of the $11^{th}$ NMOS tube are connected to the power supply respectively; a drain of the $7^{th}$ PMOS tube, a drain of the $8^{th}$ NMOS tube, a drain of the $10^{th}$ NMOS tube and a grid of the $8^{th}$ PMOS tube are connected to a grid of the $9^{th}$ NMOS tube; a source of the $8^{th}$ NMOS tube and a source of the $9^{th}$ NMOS tube are grounded respectively; a grid of the $10^{th}$ NMOS tube is connected to a grid of the $11^{th}$ NMOS tube, and the connecting terminal is the control terminal of the said drive unit; a source of the $10^{th}$ NMOS tube is the input/output terminal of the said drive unit; a source of the $11^{th}$ NMOS tube is the complementary input/output terminal of the said drive unit.

* * * * *